United States Patent
Han (10) Patent No.: US 10,345,696 B2
(45) Date of Patent: Jul. 9, 2019

(54) PHOTOMASK FOR OPTICAL ALIGNMENT AND OPTICAL ALIGNMENT METHOD

(71) Applicant: SHENZHEN CHINA STAR OPTOELECTRONICS TECHNOLOGY CO., LTD., Shenzhen, Guangdong (CN)

(72) Inventor: Bing Han, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/754,502

(22) PCT Filed: Oct. 12, 2015

(86) PCT No.: PCT/CN2015/091721
§ 371 (c)(1),
(2) Date: Feb. 22, 2018

(87) PCT Pub. No.: WO2017/035909
PCT Pub. Date: Mar. 9, 2017

(65) Prior Publication Data
US 2018/0239239 A1    Aug. 23, 2018

(30) Foreign Application Priority Data
Sep. 1, 2015 (CN) .......................... 2015 1 0553278

(51) Int. Cl.
*G03F 1/00* (2012.01)
*G03F 1/36* (2012.01)
(Continued)

(52) U.S. Cl.
CPC .......... *G03F 1/42* (2013.01); *G02F 1/133788* (2013.01); *G03F 1/00* (2013.01);
(Continued)

(58) Field of Classification Search
CPC ..... G03F 1/00; G03F 1/20; G03F 1/22; G03F 1/36; G03F 1/42; G03F 1/50; G03F 7/20;
(Continued)

(56) References Cited

U.S. PATENT DOCUMENTS 7,102,155 B2 *  9/2006  Ando ................... H01L 51/0021
                                                                257/347
7,394,095 B2 *  7/2008  Ando ................... H01L 27/1292
                                                                257/347
(Continued)

FOREIGN PATENT DOCUMENTS

CN            1637594 A           7/2005
CN          102692816 A           9/2012
(Continued)

OTHER PUBLICATIONS

International Search Report dated May 27, 2016 from corresponding application No. PCT/CN2015/091721.

*Primary Examiner* — Loha Ben
(74) *Attorney, Agent, or Firm* — Leong C. Lei (57) ABSTRACT

A photomask (2) for optical alignment and an optical alignment method. By aligning the tail ends of first light-transmission patterns (313) which form a first photomask figure (3), and aligning the front ends of second light-transmission patterns (413), which form a second photomask figure (4) in the photomask (2), the un-exposed or underexposed areas do not exist at the tail ends of first substrate units (11) and the front end of second substrate units (12) during the process of optical alignment, thereby the problem existed in the traditional optical alignment manufacture process, that the brightness of a display is not uniform due to existing unexposed or underexposed areas, is solved, meanwhile, the reduction of the distance between the first substrate units (11) and the second substrate units (12)

(Continued)

on a substrate is facilitated, thereby the utilization rate of the substrate is improved.

11 Claims, 9 Drawing Sheets

(51) Int. Cl.
*G03F 1/42* (2012.01)
*G03F 7/20* (2006.01)
*B05B 12/20* (2018.01)
*H01L 51/00* (2006.01)
*G02F 1/1337* (2006.01)

(52) U.S. Cl.
CPC ............ *G03F 7/20* (2013.01); *G03F 7/70475* (2013.01); *B05B 12/20* (2018.02); *G03F 1/36* (2013.01); *H01L 51/0011* (2013.01)

(58) Field of Classification Search
CPC . G03F 7/70475; G01T 1/2006; G01T 1/2018; G02F 1/133753; G02F 1/133788; G02F 1/1362; B05B 12/20; C23C 14/04; C23C 14/042; H01L 25/0753; H01L 27/14603; H01L 27/14623; H01L 27/14632; H01L 27/14663; H01L 27/14692; H01L 27/156; H01L 27/3283; H01L 33/505; H01L 33/60; H01L 33/62; H01L 51/0011
USPC ................ 359/290, 592, 593, 596; 430/5; 250/492.22, 496.1, 505.1, 506.1, 515.1; 257/59, 72; 118/406, 504; 345/84, 87

See application file for complete search history.

(56) References Cited

U.S. PATENT DOCUMENTS

| | | | | |
|---|---|---|---|---|
| 7,872,718 B2* | 1/2011 | Inoue | ................ | G02F 1/133788 349/123 |
| 8,054,431 B2* | 11/2011 | Inoue | ................ | G02F 1/133788 349/123 |
| 8,094,276 B2* | 1/2012 | Inoue | ................ | G02F 1/133788 349/123 |
| 8,169,576 B2* | 5/2012 | Inoue | ................ | G02F 1/133788 349/124 |
| 8,174,652 B2* | 5/2012 | Inoue | ................ | G02F 1/133788 349/124 |
| 8,189,152 B2* | 5/2012 | Nakagawa | ........ | G02F 1/133753 349/129 |
| 8,592,105 B2* | 11/2013 | Jang | .......................... | G03F 1/50 430/5 |
| 8,730,439 B2* | 5/2014 | Inoue | ................ | G02F 1/133788 349/123 |
| 8,767,156 B2* | 7/2014 | Inoue | ................ | G02F 1/133788 349/123 |
| 9,555,434 B2* | 1/2017 | Sugimoto | ............... | B05B 12/20 |

FOREIGN PATENT DOCUMENTS

| | | |
|---|---|---|
| CN | 104777674 A | 7/2015 |
| JP | 5515163 B2 | 6/2014 |

* cited by examiner

PHOTOMASK FOR OPTICAL ALIGNMENT AND OPTICAL ALIGNMENT METHOD

RELATED APPLICATIONS

The present application is a National Phase of International Application Number PCT/CN2015/091721, filed Oct. 12, 2015, and claims the priority of China Application No. 201510553278.6, filed Sep. 1, 2015.

BACKGROUND OF THE INVENTION

1. Field of the Invention

The present invention relates to the field of fabrication of liquid crystal displays, and more particular to a photomask for optical alignment and an optical alignment method.

2. The Related Arts

Liquid crystal display (LCD) has various advantages, such as thin device body, low power consumption, and being free of radiation, and has wide applications, such as liquid crystal televisions, mobile phones, personal digital assistants (PDAs), digital cameras, computer screens, and notebook computer screens.

Most of the LCDs that are currently available are backlighting LCDs, which comprise an enclosure, a liquid crystal panel arranged in the enclosure, and a backlight module mounted in the enclosure. The liquid crystal panel is generally made up of a color filter (CF) substrate, a thin-film transistor (TFT) array substrate, and a liquid crystal layer filled between the two substrates, and the working principle is that a drive voltage is applied to the CF substrate and the TFT substrate to control rotation of liquid crystal molecules of the liquid crystal layer in order to control optical output and refract out light emitting from the backlight module to generate an image.

In a fabrication process of a liquid crystal display panel, an alignment operation applied to an alignment film is an important operation for the alignment operation is applied for realizing alignment of liquid crystal molecules in a specific direction and angle. In the fabrication of TFT-LCD, two ways of alignment are known: rubbing alignment and optical alignment. Rubbing alignment is a physical process, which may generate static electricity and particle contamination. Optical alignment is a non-contact alignment technique, which uses linearly polarized light to irradiate, through a photomask, a high-molecule polymer alignment film that is sensitive to light so as to form an alignment microstructure that has a predetermined inclination angle that achieves the purpose of alignment.

Heretofore, the photomasks that are used in optical alignment generally have sizes that are smaller than the sizes of the liquid crystal televisions that are available in the market. Therefore, in actual operations of fabrication, a number of photomasks are combined together to carry out an operation simultaneously. Overlapping areas between two adjacent photomasks may be subjected to light irradiation twice.

To maximally increase the utilization of a substrate, a design that arranges multiple substrate units having two or more than two size specifications on a large-sized substrate is adopted and is referred to as a MMG (Multi-Mode Glass) product. To coat an alignment film on such a large-sized substrate, different light-transmission patterns must be provided on the photomasks in order to carry out alignment on the substrate units of different sizes.

Figure 1:
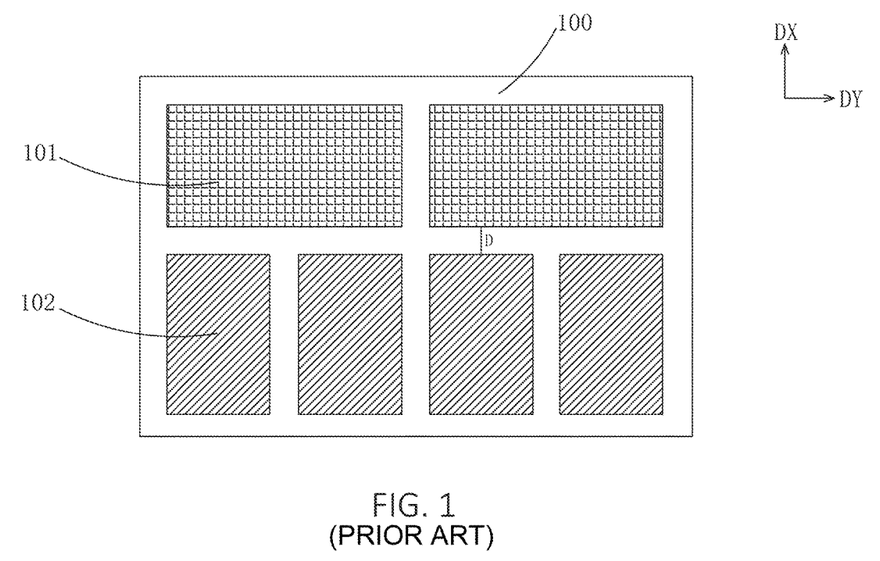
FIG. 1 is a schematic view illustrating a conventional structure of a substrate coated with an alignment film.

As shown in FIG. 1, a conventional structure of a substrate 100 that is coated with an alignment film is shown. The substrate 100 is provided thereon with a plurality of substrate units. The plurality of substrate units comprises a plurality of first substrate units 101 arranged in a first line on the substrate 100 and a plurality of second substrate units 102 in a second line, wherein utilization of the substrate 100 can be increased, if a spacing distance D between the first substrate units 101 of the first line and the second substrate units 102 of the second line is made smaller.

Figure 2:
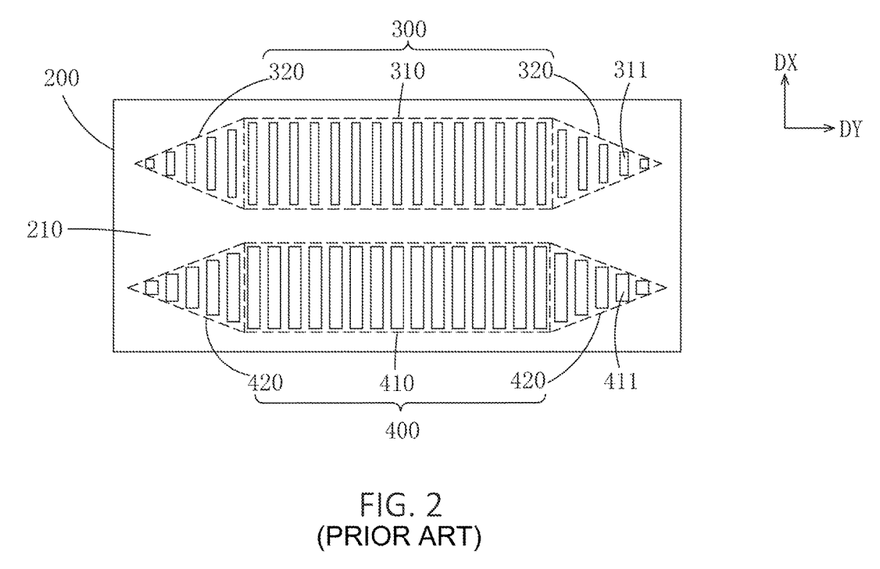
FIG. 2 is a schematic view illustrating a conventional structure of a photomask for optical alignment.

As shown in FIG. 2, a conventional photomask 200 that is used for optical alignment comprises a photomask body 210 and a first photomask figure 300 and a second photomask figure 400 provided on the photomask body 210 for exposure of the above-mentioned first substrate units 101 and second substrate units 102. The first photomask figure 300 and the second photomask figure 400 are arranged on the photomask body 210 in a first direction DX and are spaced from each other by a predetermined distance.

The first photomask figure 300 comprises a first body 310, which is arranged in the middle, and first interlacing sections 320 respectively arranged on two sides of the first body 310.

The first body 310 and the first interlacing sections 320 are formed of a plurality of first light-transmission patterns 311 that are arranged in a second direction DY that is perpendicular to the first direction DX, wherein multiple ones of the plurality of first light-transmission patterns 311 that form the first body 310 have heights that are identical and have two ends that are in alignment; and multiple ones of the plurality of first light-transmission patterns 311 that form the first interlacing sections 320 have heights that are reduced, in sequence, from a side thereof that is adjacent to the first body 310 toward a side that is distant from the first body 310 and the first interlacing sections 320 are arranged such that upper and lower sides thereof are symmetric.

The second photomask figure 400 comprises a second body 410, which is arranged in the middle, and second interlacing sections 420 respectively arranged on two sides of the second body 410.

The second body 410 and the second interlacing sections 420 are formed of a plurality of second light-transmission patterns 411 that are arranged in the second direction DY that is perpendicular to the first direction DX, wherein multiple ones of the plurality of second light-transmission patterns 411 that form the second body 410 have heights that are identical and have two ends that are in alignment; and multiple ones of the plurality of second light-transmission patterns 411 that form the first interlacing sections 320 have heights that are reduced, in sequence, from a side thereof that is adjacent to the second body 410 toward a side that is distant from the second body 410 and the second interlacing sections 420 are arranged such that upper and lower sides thereof are symmetric.

Figure 3:
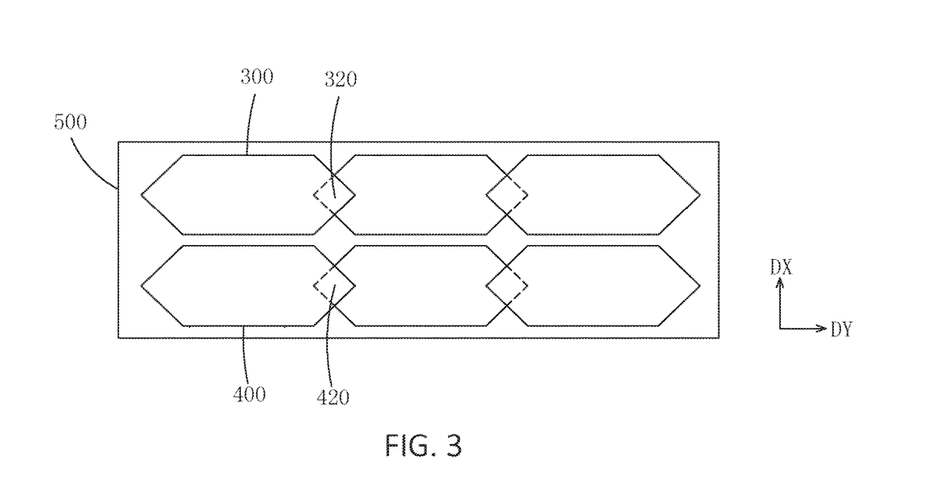
FIG. 3 is a schematic view illustrating a structure of a combined photomask formed of multiple ones of the photomask shown in FIG. 2 interlaced and combined together.

As shown in FIG. 3, oftentimes, a number of the photomask 200 shown in FIG. 1 are combined in an interlacing manner in order to carry out exposure of the substrate 100 shown in FIG. 1. The plurality of photomask 200 are so interlaced and combined such that, for two adjacent ones of the photomasks 200, the first interlacing sections 320 of the first photomask figures 300 interlace and overlap each other and the second interlacing sections 420 of the second photomask figure 400 interlace and overlap each other to form a combined photomask 500.

As shown in FIGS. 4-9, schematic views are provided to illustrate optical alignment of the substrate 1 shown in FIG.

Figure 4:
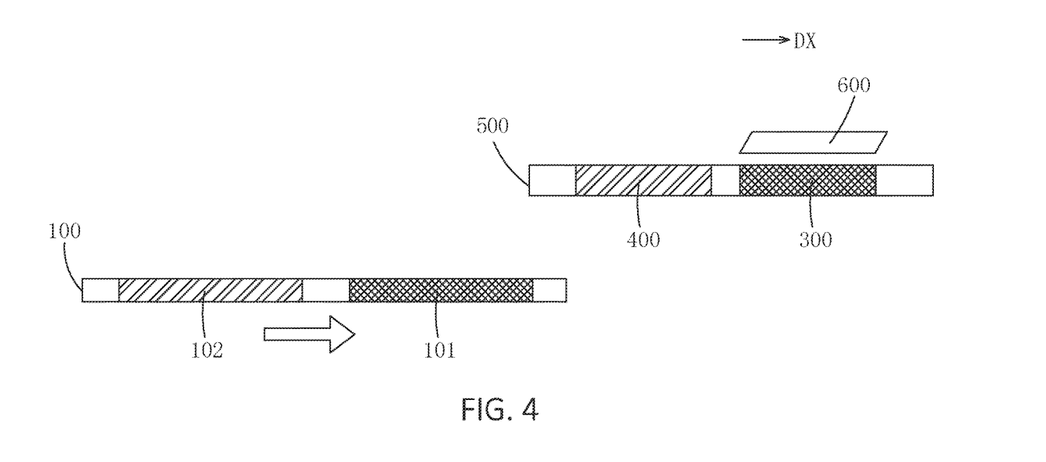
FIG. 4 is a schematic view illustrating Step 1 of a known optical alignment method.
Figure 5:
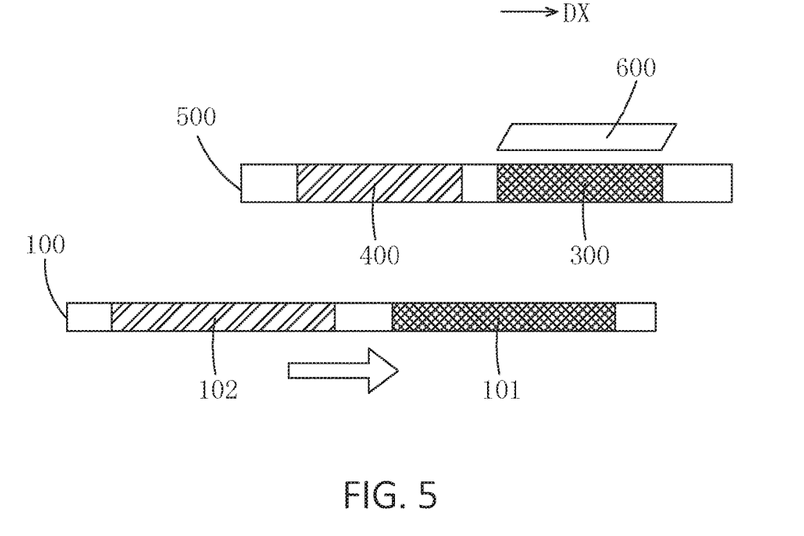
FIG. 5 is a schematic view illustrating Step 2 of the known optical alignment method.
Figure 6:
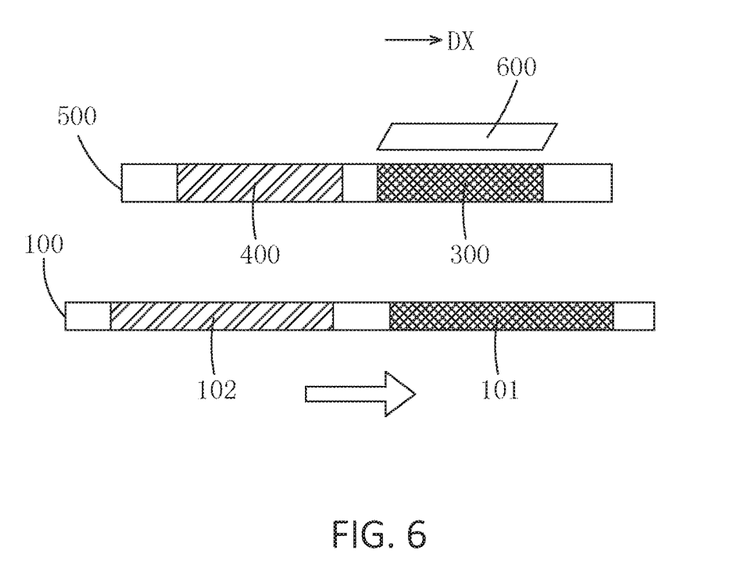
FIGS. 6-7 are schematic views illustrating Step 3 of the known optical alignment method.
Figure 7:
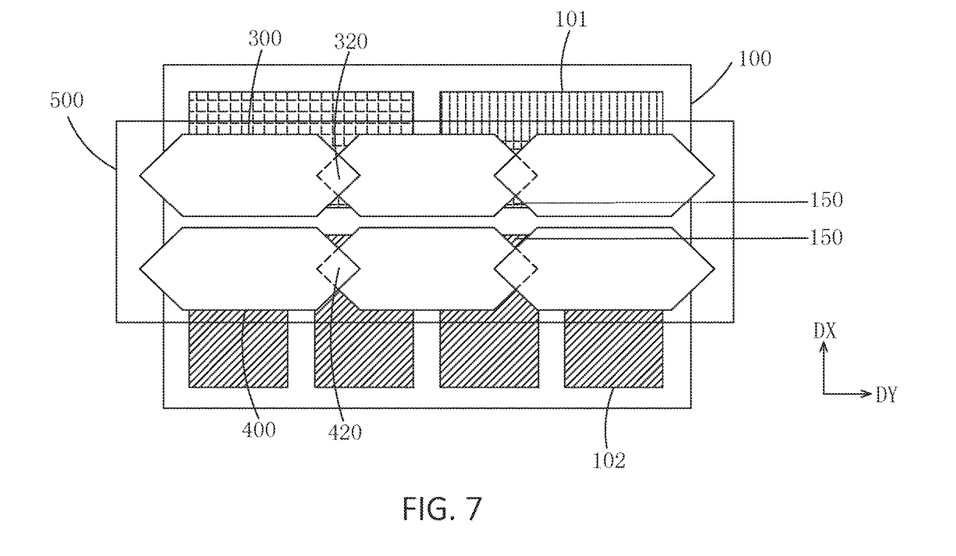
Figure 8:
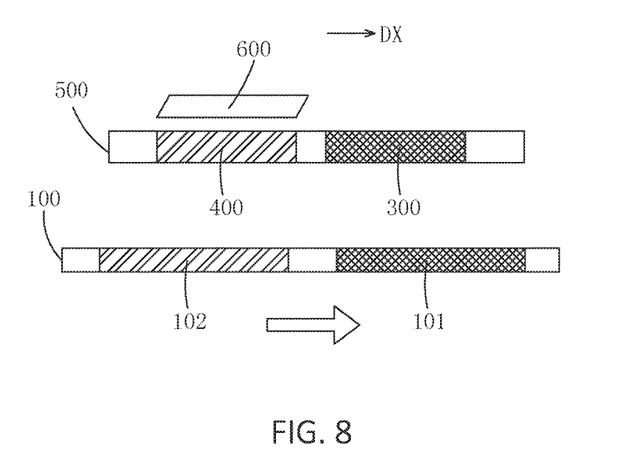
FIGS. 8-9 are schematic views illustrating Step 4 of the known optical alignment method.
Figure 9:
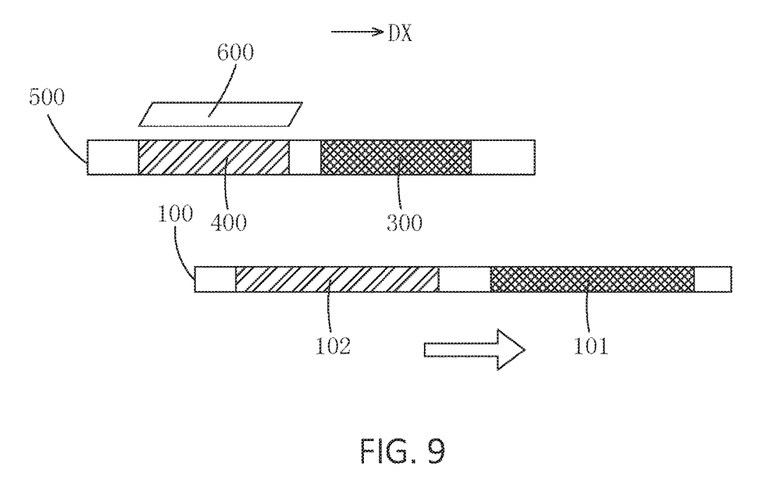

1 is carried out with the combined photomask 500 shown in FIG. 1. The optical alignment method comprises the following steps:

Step 1: as shown in FIG. 4, providing a substrate 100 that is coated with an alignment film, a combined photomask 500, and a light source 600;

wherein the first photomask figures 300 of the combined photomask 500 are arranged under the light source 600 so that light emitting from the light source 600 transmits through the first light-transmission patterns 311; and then, alignment between the substrate 100 and the combined photomask 500 is performed;

Step 2: as shown in FIG. 5, carrying out translation of the substrate 100 in the first direction DX to have the first substrate units 101 located under the first photomask figures 300 of the combined photomask 500 and the light emitting from the light source 600 and transmitting through the first light-transmission patterns 311 of the first photomask figures 300 to carry out exposure of all the first substrate units 10;

Step 3: as shown in FIGS. 6 and 7, when the translation of the substrate 100 is such that a tail end of the first substrate units 101 goes beyond a tail end of the first photomask figures 300 and a front end of the second photomask figures 400 gets beyond a front end of the second substrate units 102, carrying out further translation of the alignment-film-coated substrate 100, while conducting translation of the combined photomask 500;

Step 4: as shown in FIG. 8, when the translation of the combined photomask 500 is such that the second photomask figures 400 of the combined photomask 500 are located under the light source 600, stopping movement of the combined photomask 500, and as shown in FIG. 9, carrying further translation of the substrate 100 in the first direction DX so that light transmitting through the second light-transmission patterns 411 to carry out exposure of the second substrate units 102 of the substrate 1, whereby exposure of all the first substrate units 101 and the second substrate units 102 provided on the substrate 100 is completed.

As shown in FIG. 7, in the above-described optical alignment method, during switching between the first photomask figures 300 and the second photomask figures 400, it is often that a small un-exposed or under-exposed area 150 is generated in a portion of the tail end of the first substrate units 101 that is located behind an overlapping area of the first interlacing sections 320 and in a portion of the front end of the second substrate units 102 that is located in front of an overlapping area of the second interlacing sections 42, so that issues of mura (which are a phenomenon of inhomogeneous brightness of a liquid crystal display) may occur in a display panel that is subsequently fabricated by using the first substrate units 101 and the second substrate units 102.

To cope with the above-described technical issues occurring in an exposure process, a known solution is increasing the distance D between the first substrate units 101 and the second substrate units 102 of the substrate 100, so that in switching the first photomask figures 300 and the second photomask figures 400, the tail end of the first substrate units 101 can be completely covered by the first photomask figures 300 and the front end of the second substrate units 102 can be completely covered by the second photomask figures 400 thereby avoiding the occurrence of un-exposed or under-exposed areas in the first substrate units 101 and the second substrate units 102 to eliminate the issues of mura. However, such a solution makes the distance between the first substrate units 101 and the second substrate units 102 of the substrate enlarged, leading to issues of being adverse to product designs and low utilization of substrate Thus, it is desired to have a novel solution that overcomes the issues of mura and low utilization of substrate occurring in the known optical alignment process.

SUMMARY OF THE INVENTION

An objective of the present invention is to provide a photomask for optical alignment, which improves alignment performance, avoids mura issues caused by un-exposed or under-exposed areas existing in alignment of a MMG product, and also helps increase utilization of a substrate.

Another objective of the present invention is to provide an optical alignment method, which improves alignment performance, avoids mura issues caused by un-exposed or insufficiently-exposed areas present in alignment of a MMG product, and also helps increase utilization of a substrate.

To achieve the above objectives, the present invention provides a photomask for optical alignment, which comprises a photomask body and a first photomask figure and a second photomask figure arranged on the photomask body, the first photomask figure and the second photomask figure being arranged in a first direction on the photomask body and spaced from each other by a predetermined distance;

wherein the first photomask figure comprises a first body that is located in a middle and first interlacing sections that are located on two sides of the first body;

the first body and the first interlacing sections are both formed of multiple first light-transmission patterns arranged in a second direction that is perpendicular to the first direction, wherein the multiple first light-transmission patterns that form the first body have identical heights; the multiple first light-transmission patterns that form the first interlacing sections have heights that are reduced from a side thereof that is adjacent to the first body toward a side thereof that is distant from the first body; and all the first light-transmission patterns that form the first body and the first interlacing sections have ends that are adjacent to the second photomask figure and are aligned with each other;

the second photomask figure comprises a second body that is located in a middle and second interlacing sections that are located on two sides of the second body; and the second body and the second interlacing sections are both formed of multiple second light-transmission patterns arranged in the second direction, wherein the multiple second light-transmission patterns that form the second body have identical heights; the multiple second light-transmission patterns that form the second interlacing sections have heights that are reduced from a side thereof that is adjacent to the second body toward a side thereof that is distant from the second body; and all the second light-transmission patterns that form the second body and the second interlacing sections have ends that are adjacent to the first photomask figure and are aligned with each other.

The heights of the multiple first light-transmission patterns that form the first interlacing sections are decreased linearly from the side thereof adjacent to the first body toward the side thereof distant from the first body; and the heights of the multiple second light-transmission patterns that form the second interlacing sections are decreased linearly from the side thereof adjacent to the second body toward the side thereof distant from the second body.

All the first light-transmission patterns that form the first body and the first interlacing sections have identical widths;

and all the second light-transmission patterns that form the second body and the second interlacing sections have identical widths.

The first light-transmission patterns and the second light-transmission patterns are rectangular in shape.

The first light-transmission patterns and the second light-transmission patterns are formed by subjecting a metal layer deposited on quartz glass sheet to photolithography.

The present invention also provides an optical alignment method, which comprises the following steps:

Step 1, providing a substrate that is coated with an alignment film, a plurality of photomasks for optical alignment, and a light source;

wherein the substrate comprises a plurality of first substrate units and a plurality of second substrate units that are arranged in two lines in a first direction, the plurality of first substrate units being arranged in a first line on the substrate in a second direction that is perpendicular to the first direction, the plurality of second substrate units being arranged in a second line on the substrate in the second direction;

the photomasks for optical alignment each comprise a photomask body and a first photomask figure and a second photomask figure that are arranged on the photomask body for exposure of the first substrate units and the second substrate units respectively; and the first photomask figure and the second photomask figure are arranged in the first direction on the photomask body and are spaced from each other by a predetermined distance;

the first photomask figure comprises a first body that is located in a middle and first interlacing sections that are located on two sides of the first body;

the first body and the first interlacing sections are both formed of multiple first light-transmission patterns arranged in the second direction, wherein the multiple first light-transmission patterns that form the first body have identical heights; the multiple first light-transmission patterns that form the first interlacing sections have heights that are reduced from a side thereof that is adjacent to the first body toward a side thereof that is distant from the first body; and all the first light-transmission patterns that form the first body and the first interlacing sections have ends that are adjacent to the second photomask figure and are aligned with each other;

the second photomask figure comprises a second body that is located in a middle and second interlacing sections that are located on two sides of the second body; and the second body and the second interlacing sections are both formed of multiple second light-transmission patterns arranged in the second direction, wherein the multiple second light-transmission patterns that form the second body have identical heights; the multiple second light-transmission patterns that form the second interlacing sections have heights that are reduced from a side thereof that is adjacent to the second body toward a side thereof that is distant from the second body; and all the second light-transmission patterns that form the second body and the second interlacing sections have ends that are adjacent to the first photomask figure and are aligned with each other;

Step 2, interlacing and combining the plurality of photomasks for optical alignment such that for two adjacent ones of the photomasks, the first interlacing sections of the first photomask figures are interlaced and overlapped and the second interlacing sections of the second photomask figures are interlaced and overlapped to form a combined photomask;

wherein the first photomask figures of the combined photomask are set under the light source and light emitting from the light source transmits through the first light-transmission patterns; and then, positional alignment is conducted between the substrate and the combined photomask;

Step 3, conducting translation of the substrate in the first direction such that the first substrate units are located under the first photomask figures of the combined photomask and the light emitting from the light source and transmitting through the first light-transmission patterns of the first photomask figures carries out exposure of all the first substrate units;

Step 4, when the translation of the substrate is such that a tail end of the first substrate units goes beyond a tail end of the first photomask figures and a front end of the second photomask figures gets beyond a front end of the second substrate units, continuing the translation of the substrate, while conducting translation of the combined photomask; and Step 5, when the translation of the combined photomask is such that the second photomask figures of the combined photomask are located under the light source, stopping the translation of the combined photomask, and continuing the translation of the substrate in the first direction, such that light is allowed to transmit through the second light-transmission patterns to carry out exposure of all the second substrate units of the substrate to complete exposure of all the first substrate units and the second substrate units of the substrate.

The heights of the multiple first light-transmission patterns that form the first interlacing sections are decreased linearly from the side thereof adjacent to the first body toward the side thereof distant from the first body; and the heights of the multiple second light-transmission patterns that form the second interlacing sections are decreased linearly from the side thereof adjacent to the second body toward the side thereof distant from the second body.

All the first light-transmission patterns that form the first body and the first interlacing sections have identical widths; and all the second light-transmission patterns that form the second body and the second interlacing sections have identical widths.

The first light-transmission patterns and the second light-transmission patterns are rectangular in shape; and the first light-transmission patterns and the second light-transmission patterns are formed by subjecting a metal layer deposited on quartz glass sheet to photolithography.

In the optical alignment process, a position of the light source is kept immobile.

The present invention further provides a photomask for optical alignment, which comprises a photomask body and a first photomask figure and a second photomask figure arranged on the photomask body, the first photomask figure and the second photomask figure being arranged in a first direction on the photomask body and spaced from each other by a predetermined distance;

wherein the first photomask figure comprises a first body that is located in a middle and first interlacing sections that are located on two sides of the first body;

the first body and the first interlacing sections are both formed of multiple first light-transmission patterns arranged in a second direction that is perpendicular to the first direction, wherein the multiple first light-transmission patterns that form the first body have identical heights; the multiple first light-transmission patterns that form the first interlacing sections have heights that are reduced from a side thereof that is adjacent to the first body toward a side thereof that is distant from the first body; and all the first light-transmission patterns that form the first body and the first interlacing sections have ends that are adjacent to the second photomask figure and are aligned with each other;

the second photomask figure comprises a second body that is located in a middle and second interlacing sections that are located on two sides of the second body; and the second body and the second interlacing sections are both formed of multiple second light-transmission patterns arranged in the second direction, wherein the multiple second light-transmission patterns that form the second body have identical heights; the multiple second light-transmission patterns that form the second interlacing sections have heights that are reduced from a side thereof that is adjacent to the second body toward a side thereof that is distant from the second body; and all the second light-transmission patterns that form the second body and the second interlacing sections have ends that are adjacent to the first photomask figure and are aligned with each other;

wherein the heights of the multiple first light-transmission patterns that form the first interlacing sections are decreased linearly from the side thereof adjacent to the first body toward the side thereof distant from the first body; and the heights of the multiple second light-transmission patterns that form the second interlacing sections are decreased linearly from the side thereof adjacent to the second body toward the side thereof distant from the second body;

wherein all the first light-transmission patterns that form the first body and the first interlacing sections have identical widths; and all the second light-transmission patterns that form the second body and the second interlacing sections have identical widths;

wherein the first light-transmission patterns and the second light-transmission patterns are rectangular in shape; and wherein the first light-transmission patterns and the second light-transmission patterns are formed by subjecting a metal layer deposited on quartz glass sheet to photolithography.

The efficacy of the present invention is that the present invention provides a photomask for optical alignment and an optical alignment method, in which the photomask is arranged such that all first light-transmission patterns that form a first photomask figure have tail ends that are set in alignment with each other and all second light-transmission patterns that form a second photomask figure have front ends that are set in alignment with each other so that in a process of optical alignment, areas of no exposure or under exposure are not present in the tail end of the first substrate units and the front end of the second substrate units. This overcomes the issue of non-uniform brightness of a display device caused by an un-exposed or under-exposed area occurring in a conventional optical alignment process and helps reduce the distance between first substrate units and second substrate units provided on a substrate thereby increasing utilization of the substrate.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 10:
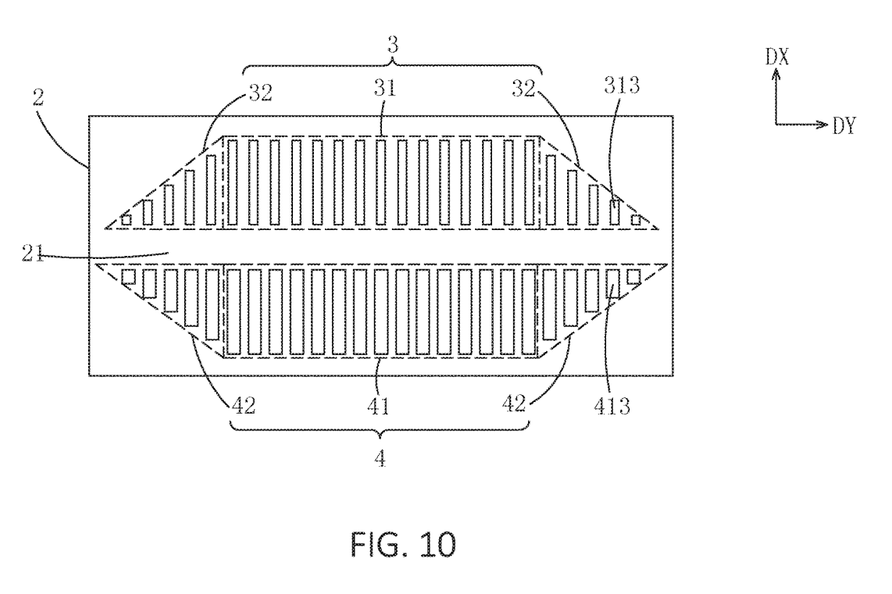
FIG. 10 is a schematic view illustrating a structure of a photomask for optical alignment according to the present invention.

Referring to FIG. 10, firstly, the present invention provides a photomask 2 for optical alignment, which comprises a photomask body 21 and a first photomask figure 3 and a second photomask figure 4 arranged on the photomask body 21. The first photomask figure 3 and the second photomask figure 4 are arranged in a first direction DX on the photomask body 21 and are spaced from each other by a predetermined distance.

Specifically, the first photomask figure 3 comprises a first body 31 that is located in the middle and first interlacing sections 32 that are located on two sides of the first body 31.

The first body 31 and the first interlacing sections 32 are both formed of multiple first light-transmission patterns 313 arranged in a second direction DY that is perpendicular to the first direction DX, wherein the multiple first light-transmission patterns 313 that form the first body have identical heights, and the multiple first light-transmission patterns 313 that form the first interlacing sections 32 have heights that are reduced from a side thereof that is adjacent to the first body 31 toward a side thereof that is distant from the first body 31; and all the first light-transmission patterns 313 that form the first body 31 and the first interlacing sections 32 have ends that are adjacent to the second photomask figure 4 and are aligned with each other.

Specifically, the second photomask figure 4 comprises a second body 41 that is located in the middle and second interlacing sections 42 that are located on two sides of the second body 41.

The second body 41 and the second interlacing sections 42 are both formed of multiple second light-transmission patterns 413 arranged in the second direction DY, wherein the multiple second light-transmission patterns 413 that form the second body 41 have identical heights, and the multiple second light-transmission patterns 413 that form the second interlacing sections 42 have heights that are reduced from a side thereof that is adjacent to the second body 41 toward a side thereof that is distant from the second body 41 and all the second light-transmission patterns 413 that form the second body 41 and the second interlacing sections 42 have ends that are adjacent to the first photomask figure 3 and are aligned with each other.

Specifically, the heights of the multiple first light-transmission patterns 313 that form the first interlacing sections 32 are decreased linearly from the side thereof adjacent to the first body 31 toward the side thereof distant from the first body 31; and the heights of the multiple second light-transmission patterns 413 that form the second interlacing sections 42 are decreased linearly from the side thereof adjacent to the second body 41 toward the side thereof distant from the second body 31.

Specifically, all the first light-transmission patterns 313 that form the first body 31 and the first interlacing sections 32 have identical widths; and all the second light-transmission patterns 413 that form the second body 41 and the second interlacing sections 42 have identical widths.

Specifically, the first light-transmission patterns 313 and the second light-transmission patterns 413 are rectangular in shape.

A number of the photomask 2 for optical alignment according to the present invention can be combined and a combined photomask so formed can be used to carry out optical alignment on two kinds of substrate unit provided on a substrate. Since, in the present invention, lower ends of the first photomask figures are set in alignment with each other and upper ends of the second photomask figure are set in alignment with each other, no under-exposed or un-exposed situation may occur at a tail end of the first substrate units and a front end of the second substrate units in switching between the first photomask figures and the second photomask figures thereby allowing for reduction of a distance between the first substrate units and the second substrate units of a substrate and increasing utilization of the substrate.

Figure 11:
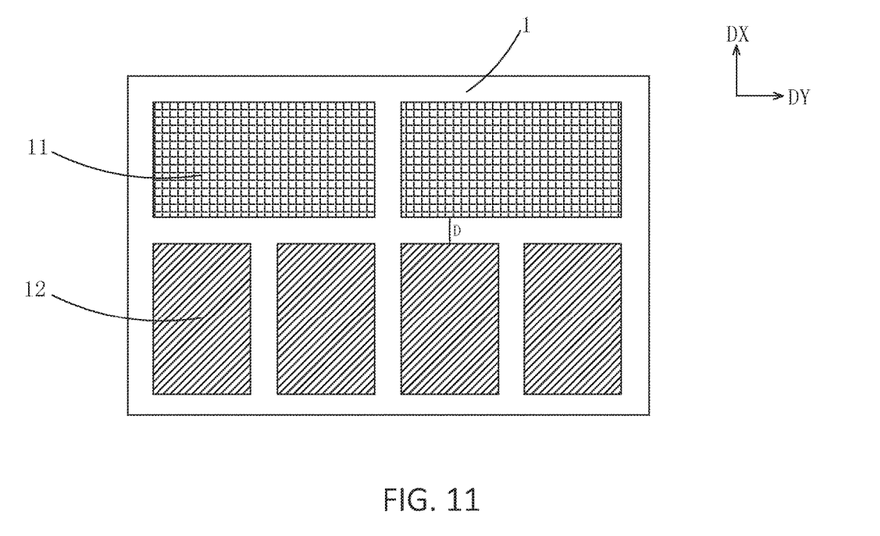
FIG. 11 is a schematic view illustrating a structure of a substrate coated with an alignment film according to the present invention.
Figure 13:
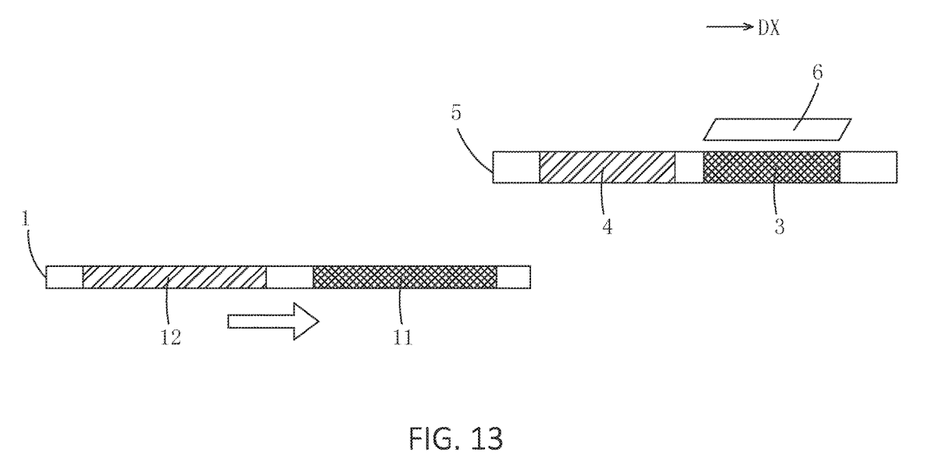
FIG. 13 is a schematic view illustrating Step 2 of an optical alignment method according to the present invention.

Based on the photomask for optical alignment, referring to FIGS. 10-18, the present invention also provides an optical alignment method, which comprises the following steps:

Step 1, referring to FIGS. 10, 11, and 13, providing a substrate 1 that is coated with an alignment film, a plurality of photomasks 2 for optical alignment, and a light source 6.

As shown in FIG. 11, the substrate 1 comprises a plurality of first substrate units 11 and a plurality of second substrate units 12 that are arranged in two lines in a first direction DX. The plurality of first substrate units 11 are arranged in a first line on the substrate 1 in a second direction DY that is perpendicular to the first direction DX. The plurality of second substrate units 12 are arranged in a second line on the substrate 1 in the second direction DY.

As shown in FIG. 10, the photomask 2 for optical alignment comprises a photomask body 21 and a first photomask figure 3 and a second photomask figure 4 that are arranged on the photomask body 21 for exposure of the first substrate units 11 and the second substrate units 12 respectively. The first photomask figure 3 and the second photomask figure 4 are arranged in the first direction DX on the photomask body 21 and are spaced from each other by a predetermined distance.

Specifically, the first photomask figure 3 comprises a first body 31 that is located in the middle and first interlacing sections 32 that are located on two sides of the first body 31.

The first body 31 and the first interlacing sections 32 are both formed of multiple first light-transmission patterns 313 arranged in the second direction DY, wherein the multiple first light-transmission patterns 313 that form the first body 31 have identical heights, and the multiple first light-transmission patterns 313 that form the first interlacing sections 32 have heights that are reduced from a side thereof that is adjacent to the first body 31 toward a side thereof that is distant from the first body 31 and all the first light-transmission patterns 313 that form the first body 31 and the first interlacing sections 32 have ends that are adjacent to the second photomask figure 4 and are aligned with each other.

The second photomask figure 4 comprises a second body 41 that is located in the middle and second interlacing sections 42 that are located on two sides of the second body 41.

The second body 41 and the second interlacing sections 42 are both formed of multiple second light-transmission patterns 413 arranged in the second direction DY, wherein the multiple second light-transmission patterns 413 that form the second body 41 have identical heights, and the multiple second light-transmission patterns 413 that form the second interlacing sections 42 have heights that are reduced from a side thereof that is adjacent to the second body 41 toward a side thereof that is distant from the second body 41 and all the second light-transmission patterns 413 that form the second body 41 and the second interlacing sections 42 have ends that are adjacent to the first photomask figure 3 and are aligned with each other.

Specifically, in the photomask 2 for optical alignment, the heights of the multiple first light-transmission patterns 313 that form the first interlacing sections 32 are decreased linearly from the side thereof adjacent to the first body 31 toward the side thereof distant from the first body 31; and the heights of the multiple second light-transmission patterns 413 that form the second interlacing sections 42 are decreased linearly from the side thereof adjacent to the second body 41 toward the side thereof distant from the second body 31.

Further, all the first light-transmission patterns 313 that form the first body 31 and the first interlacing sections 32 have identical widths; and all the second light-transmission patterns 413 that form the second body 41 and the second interlacing sections 42 have identical widths.

Preferably, the first light-transmission patterns 313 and the second light-transmission patterns 413 are rectangular in shape.

Further, the first light-transmission patterns 313 and the second light-transmission patterns 413 are formed by subjecting a metal layer deposited on quartz glass sheet to photolithography.

Preferably, the metal layer is formed of material comprising chromium (Cr).

Figure 12:
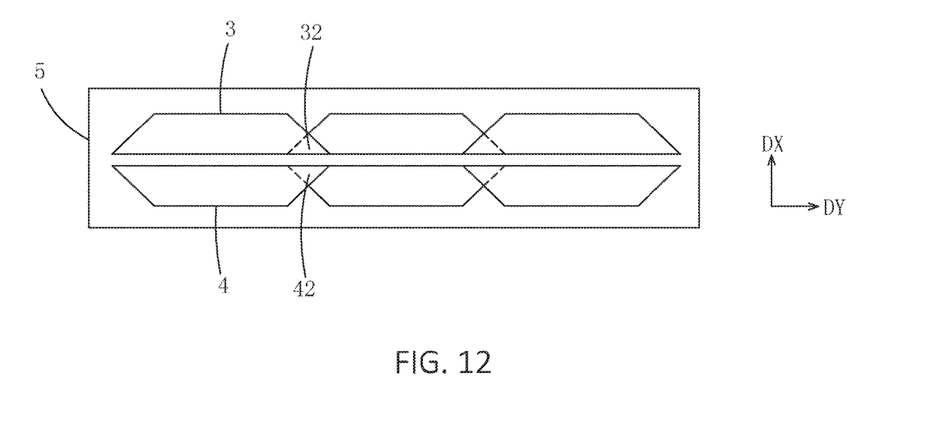
FIG. 12 is a schematic view illustrating a structure of a combined photomask formed of multiple ones of the photomask shown in FIG. 10 interlaced and combined together.

Step 2: as shown in FIG. 12, interlacing and combining the plurality of photomasks 2 for optical alignment such that for two adjacent ones of the photomasks 2, the first interlacing sections 32 of the first photomask figure 3 are interlaced and overlapped and the second interlacing sections 42 of the second photomask figure 4 are interlaced and overlapped to form a combined photomask 5.

As shown in FIG. 13, the first photomask figure 3 of the combined photomask 5 are set under the light source 6 and light emitting from the light source 6 transmits through the first light-transmission patterns 313.

Then, positional alignment is conducted between the substrate 1 and the combined photomask 5.

Figure 14:
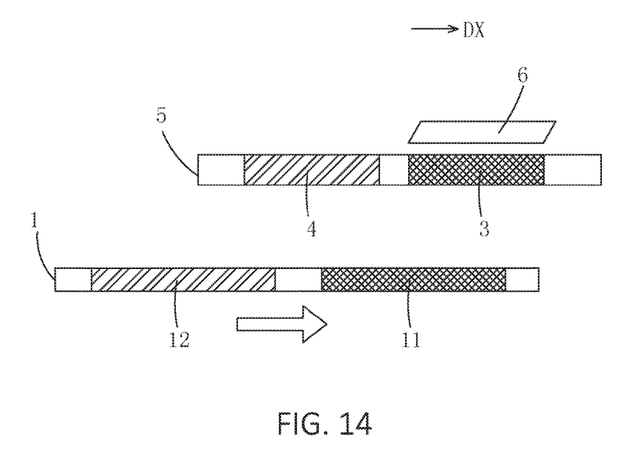
FIG. 14 is a schematic view illustrating Step 3 of the optical alignment method according to the present invention.

Step 3: as shown in FIG. 14, conducting translation of the substrate 1 in the first direction DX such that the first substrate units 11 are located under the first photomask figures 3 of the combined photomask 5 and the light emitting from the light source 6 and transmitting through the first light-transmission patterns 313 of the first photomask figures 3 carries out exposure of all the first substrate units 11.

Figure 15:
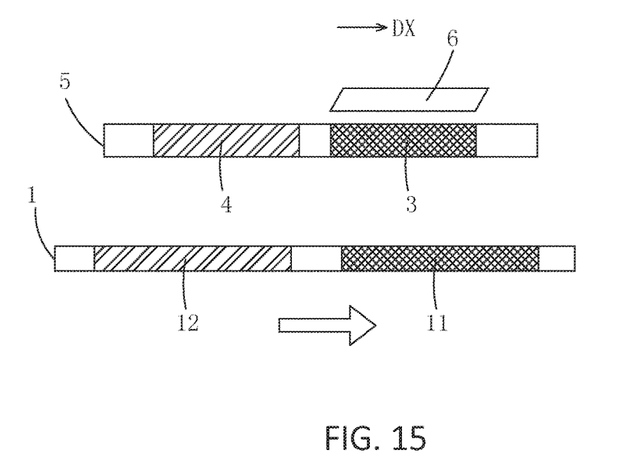
FIGS. 15-16 are schematic views illustrating Step 4 of the optical alignment method according to the present invention.
Figure 16:
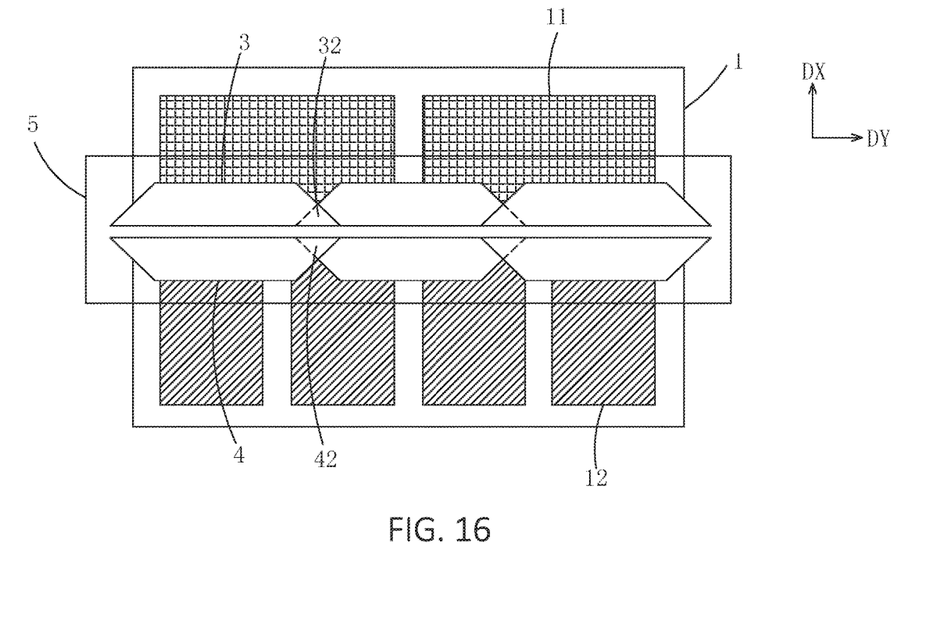

Step 4: as shown in FIGS. 15 and 16, when the translation of the substrate 1 is such that a tail end of the first substrate units 11 goes beyond a tail end of the first photomask figure 3 and a front end of the second photomask figure 4 gets beyond a front end of the second substrate units 12, continuing the translation of the substrate 1, while conducting translation of the combined photomask 5.

In the known photomask for optical alignment, in the above-described Step 3, it is often that issues of no exposure or under exposure occur in a small area in the tail end of the first substrate units 11 that is located behind an interlacing and overlapping site of the first interlacing sections 32 and also in a small area in the front end of the second substrate units 12 that is located in front of an interlacing and overlapping site of the second interlacing sections 42 so as to create mura in the first substrate units 11 and the second substrate units 12. Oppositely, in the photomask for optical alignment according to the present invention, the tail ends of all the first light-transmission patterns 313 that form the first photomask figure 3 are set in alignment and the front ends of all the second light-transmission patterns 413 that form the second photomask figure 4 are set in alignment so that in a process of exposure, no area that is not exposed or that is under exposed may exist in the tail end of the first substrate units 11 and the front end of the second substrate units 12, and thus the first substrate units 11 and the second substrate units 12 are exposed uniformly to thereby eliminating the issues of mura.

Figure 17:
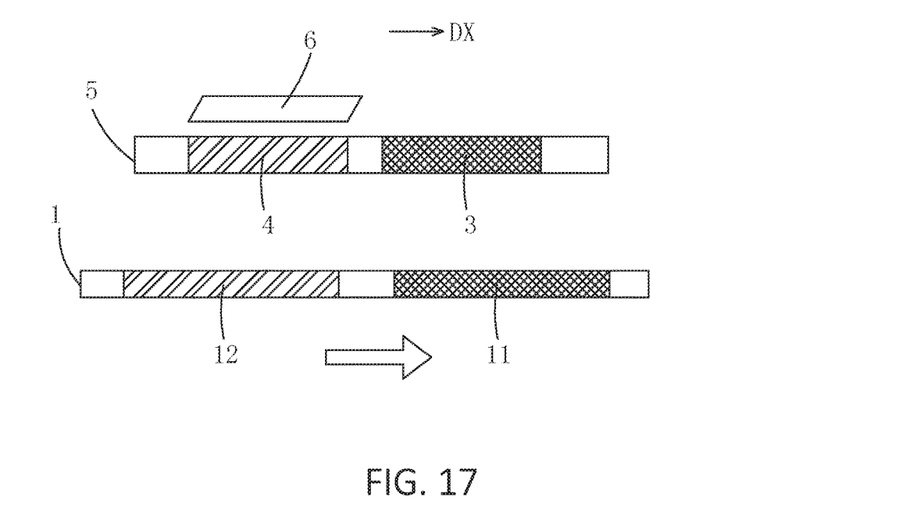
FIGS. 17-18 are schematic views illustrating Step 5 of the optical alignment method according to the present invention.
Figure 18:
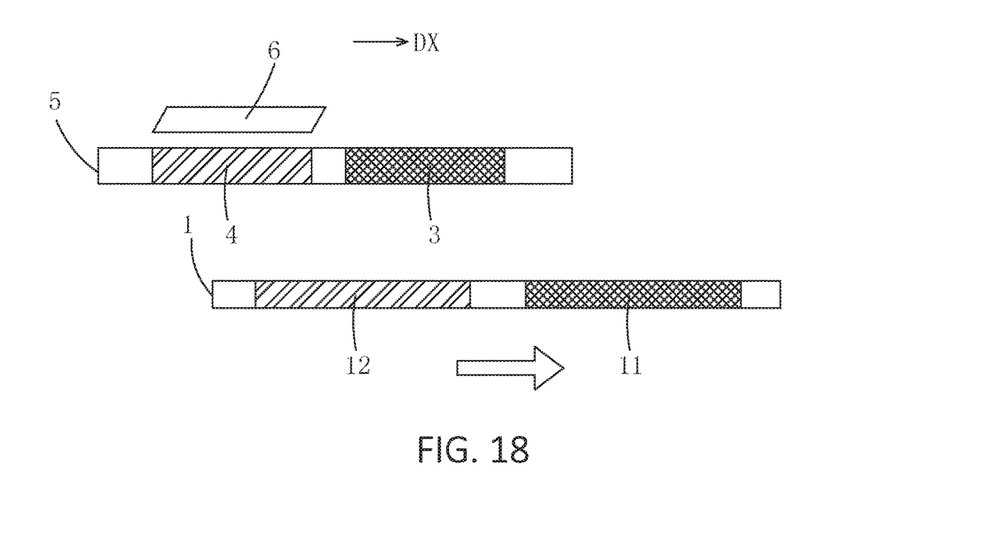

Step 5: as shown in FIG. 17, when the translation of the combined photomask 5 is such that the second photomask figure 4 of the combined photomask 5 are located under the light source 6, stopping the translation of the combined photomask 5, and as shown in FIG. 18, continuing the translation of the substrate 1 in the first direction DX, such that light is allowed to transmit through the second light-transmission patterns 22 to carry out exposure of all the second substrate units 12 of the substrate 1 to complete exposure of all the first substrate units 101 and the second substrate units 102 of the substrate 1.

Specifically, in the above-described optical alignment method, the light source 6 is immobile in respect of the position thereof.

Preferably, the light source 6 comprises an ultraviolet light source.

In summary, the present invention provides a photomask for optical alignment and an optical alignment method, in which the photomask is arranged such that all first light-transmission patterns that form a first photomask figure have tail ends that are set in alignment with each other and all second light-transmission patterns that form a second photomask figure have front ends that are set in alignment with each other so that in a process of optical alignment, areas of no exposure or under exposure are not present in the tail end of the first substrate units and the front end of the second substrate units. This overcomes the issue of non-uniform brightness of a display device caused by an un-exposed or under-exposed area occurring in a conventional optical alignment process and helps reduce the distance between first substrate units and second substrate units provided on a substrate thereby increasing utilization of the substrate.

Based on the description given above, those having ordinary skills in the art may easily contemplate various changes and modifications of he technical solution and the technical ideas of the present invention. All these changes and modifications are considered belonging to the protection scope of the present invention as defined in the appended claims.

What is claimed is:

1. A photomask for optical alignment, comprising a photomask body and a first photomask figure and a second photomask figure arranged on the photomask body, the first photomask figure and the second photomask figure being arranged in a first direction on the photomask body and spaced from each other by a predetermined distance;

wherein: the first photomask figure comprises a first body that is located in a middle and first interlacing sections that are located on two sides of the first body;

the first body and the first interlacing sections are both formed of multiple first light-transmission patterns arranged in a second direction that is perpendicular to the first direction, wherein the multiple first light-transmission patterns that form the first body have identical heights; the multiple first light-transmission patterns that form the first interlacing sections have heights that are reduced from a side thereof that is adjacent to the first body toward a side thereof that is distant from the first body; and all the first light-transmission patterns that form the first body and the first interlacing sections have ends that are adjacent to the second photomask figure and are aligned with each other;

the second photomask figure comprises a second body that is located in a middle and second interlacing sections that are located on two sides of the second body; and the second body and the second interlacing sections are both formed of multiple second light-transmission patterns arranged in the second direction, wherein the multiple second light-transmission patterns that form the second body have identical heights; the multiple second light-transmission patterns that form the second interlacing sections have heights that are reduced from a side thereof that is adjacent to the second body toward a side thereof that is distant from the second body; and all the second light-transmission patterns that form the second body and the second interlacing sections have ends that are adjacent to the first photomask figure and are aligned with each other.

2. The photomask for optical alignment according to claim 1, wherein: the heights of the multiple first light-transmission patterns that form the first interlacing sections are decreased linearly from the side thereof adjacent to the first body toward the side thereof distant from the first body; and the heights of the multiple second light-transmission patterns that form the second interlacing sections are decreased linearly from the side thereof adjacent to the second body toward the side thereof distant from the second body.

3. The photomask for optical alignment according to claim 1, wherein: all the first light-transmission patterns that form the first body and the first interlacing sections have identical widths; and all the second light-transmission patterns that form the second body and the second interlacing sections have identical widths.

4. The photomask for optical alignment according to claim 1, wherein the first light-transmission patterns and the second light-transmission patterns are rectangular in shape.

5. The photomask for optical alignment according to claim 1, wherein the first light-transmission patterns and the second light-transmission patterns are formed by subjecting a metal layer deposited on quartz glass sheet to photolithography.

6. An optical alignment method, comprising the following steps:
   Step 1, providing a substrate that is coated with an alignment film, a plurality of photomasks for optical alignment, and a light source;
   wherein: the substrate comprises a plurality of first substrate units and a plurality of second substrate units that are arranged in two lines in a first direction, the plurality of first substrate units being arranged in a first line on the substrate in a second direction that is perpendicular to the first direction, the plurality of second substrate units being arranged in a second line on the substrate in the second direction;
   the photomasks for optical alignment each comprise a photomask body and a first photomask figure and a second photomask figure that are arranged on the photomask body for exposure of the first substrate units and the second substrate units, respectively, and the first photomask figure and the second photomask figure are arranged in the first direction on the photomask body and are spaced from each other by a predetermined distance;
   the first photomask figure comprises a first body that is located in a middle and first interlacing sections that are located on two sides of the first body;
   the first body and the first interlacing sections are both formed of multiple first light-transmission patterns arranged in the second direction, wherein the multiple first light-transmission patterns that form the first body have identical heights; the multiple first light-transmission patterns that form the first interlacing sections have heights that are reduced from a side thereof that is adjacent to the first body toward a side thereof that is distant from the first body; and all the first light-transmission patterns that form the first body and the first interlacing sections have ends that are adjacent to the second photomask figure and are aligned with each other;
   the second photomask figure comprises a second body that is located in a middle and second interlacing sections that are located on two sides of the second body; and
   the second body and the second interlacing sections are both formed of multiple second light-transmission patterns arranged in the second direction, wherein the multiple second light-transmission patterns that form the second body have identical heights; the multiple second light-transmission patterns that form the second interlacing sections have heights that are reduced from a side thereof that is adjacent to the second body toward a side thereof that is distant from the second body; and all the second light-transmission patterns that form the second body and the second interlacing sections have ends that are adjacent to the first photomask figure and are aligned with each other;
   Step 2, interlacing and combining the plurality of photomasks for optical alignment such that for two adjacent ones of the photomasks, the first interlacing sections of the first photomask figures are interlaced and overlapped and the second interlacing sections of the second photomask figures are interlaced and overlapped to form a combined photomask;
   wherein: the first photomask figures of the combined photomask are set under the light source and light emitting from the light source transmits through the first light-transmission patterns; and
   then, positional alignment is conducted between the substrate and the combined photomask;
   Step 3, conducting translation of the substrate in the first direction such that the first substrate units are located under the first photomask figures of the combined photomask and the light emitting from the light source and transmitting through the first light-transmission patterns of the first photomask figures carries out exposure of all the first substrate units;
   Step 4, when the translation of the substrate is such that a tail end of the first substrate units goes beyond a tail end of the first photomask figures and a front end of the second photomask figures gets beyond a front end of the second substrate units, continuing the translation of the substrate, while conducting translation of the combined photomask; and
   Step 5, when the translation of the combined photomask is such that the second photomask figures of the combined photomask are located under the light source, stopping the translation of the combined photomask, and continuing the translation of the substrate in the first direction, such that light is allowed to transmit through the second light-transmission patterns to carry out exposure of all the second substrate units of the substrate to complete exposure of all the first substrate units and the second substrate units of the substrate.

7. The optical alignment method according to claim 6, wherein: the heights of the multiple first light-transmission patterns that form the first interlacing sections are decreased linearly from the side thereof adjacent to the first body toward the side thereof distant from the first body; and the heights of the multiple second light-transmission patterns that form the second interlacing sections are decreased linearly from the side thereof adjacent to the second body toward the side thereof distant from the second body.

8. The optical alignment method according to claim 6, wherein: all the first light-transmission patterns that form the first body and the first interlacing sections have identical widths; and all the second light-transmission patterns that form the second body and the second interlacing sections have identical widths.

9. The optical alignment method according to claim 6, wherein: the first light-transmission patterns and the second light-transmission patterns are rectangular in shape; and the first light-transmission patterns and the second light-transmission patterns are formed by subjecting a metal layer deposited on quartz glass sheet to photolithography.

10. The optical alignment method according to claim 6, wherein in the optical alignment process, a position of the light source is kept immobile.

11. A photomask for optical alignment, comprising a photomask body and a first photomask figure and a second photomask figure arranged on the photomask body, the first photomask figure and the second photomask figure being arranged in a first direction on the photomask body and spaced from each other by a predetermined distance;

wherein: the first photomask figure comprises a first body that is located in a middle and first interlacing sections that are located on two sides of the first body;

the first body and the first interlacing sections are both formed of multiple first light-transmission patterns arranged in a second direction that is perpendicular to the first direction, wherein the multiple first light-transmission patterns that form the first body have identical heights; the multiple first light-transmission patterns that form the first interlacing sections have heights that are reduced from a side thereof that is adjacent to the first body toward a side thereof that is distant from the first body; and all the first light-transmission patterns that form the first body and the first interlacing sections have ends that are adjacent to the second photomask figure and are aligned with each other;

the second photomask figure comprises a second body that is located in a middle and second interlacing sections that are located on two sides of the second body; and the second body and the second interlacing sections are both formed of multiple second light-transmission patterns arranged in the second direction, wherein the multiple second light-transmission patterns that form the second body have identical heights; the multiple second light-transmission patterns that form the second interlacing sections have heights that are reduced from a side thereof that is adjacent to the second body toward a side thereof that is distant from the second body; and all the second light-transmission patterns that form the second body and the second interlacing sections have ends that are adjacent to the first photomask figure and are aligned with each other;

wherein the heights of the multiple first light-transmission patterns that form the first interlacing sections are decreased linearly from the side thereof adjacent to the first body toward the side thereof distant from the first body; and the heights of the multiple second light-transmission patterns that form the second interlacing sections are decreased linearly from the side thereof adjacent to the second body toward the side thereof distant from the second body;

wherein all the first light-transmission patterns that form the first body and the first interlacing sections have identical widths; and all the second light-transmission patterns that form the second body and the second interlacing sections have identical widths;

wherein the first light-transmission patterns and the second light-transmission patterns are rectangular in shape; and wherein the first light-transmission patterns and the second light-transmission patterns are formed by subjecting a metal layer deposited on quartz glass sheet to photolithography.

* * * * *